United States Patent
Kim et al.

(10) Patent No.: US 12,323,146 B2
(45) Date of Patent: Jun. 3, 2025

(54) LOGIC DEVICE USING SKYRMION

(71) Applicant: Korea Advanced Institute of Science and Technology, Daejeon (KR)

(72) Inventors: Kab-Jin Kim, Daejeon (KR); Moojune Song, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 1084 days.

(21) Appl. No.: 17/232,458

(22) Filed: Apr. 16, 2021

(65) Prior Publication Data

US 2021/0367602 A1  Nov. 25, 2021

(30) Foreign Application Priority Data

May 20, 2020  (KR) .......................... 10-2020-0060519
Jan. 12, 2021  (KR) .......................... 10-2021-0003849

(51) Int. Cl.
*H03K 19/18* (2006.01)
*G06F 7/501* (2006.01)

(52) U.S. Cl.
CPC ............. *H03K 19/18* (2013.01); *G06F 7/501* (2013.01)

(58) Field of Classification Search
CPC ............. G06F 7/50–5095; G06G 7/00; G06G 7/14–162; H03K 19/00–18; G11C 11/16–161; G11C 11/18; G11C 19/08; G11C 19/0841; G11C 19/0808
See application file for complete search history.

(56) References Cited

U.S. PATENT DOCUMENTS

| | | | |
|---|---|---|---|
| 10,128,439 B1* | 11/2018 | Bilal | H03K 19/215 |
| 2010/0164543 A1* | 7/2010 | Shepard | H03K 19/21 |
| | | | 257/E21.705 |
| 2020/0412366 A1* | 12/2020 | Friedman | H03K 19/20 |

FOREIGN PATENT DOCUMENTS

| | | |
|---|---|---|
| CN | 107332554 A | 11/2017 |
| CN | 107846215 A | 3/2018 |
| WO | 2015137335 A1 | 9/2015 |

OTHER PUBLICATIONS

Zhang, Xichao "Skyrmion-Skyrmion and Skyrmion-Edge Repulsions in Skyrmion-Based Racetrack Memory." arXiv.Org, Jan. 13, 2015, arxiv.org/abs/1403.7283. (Year: 2015).*

(Continued)

*Primary Examiner* — Andrew Caldwell
*Assistant Examiner* — Huy Duong
(74) *Attorney, Agent, or Firm* — Fredrikson & Byron, P.A.

(57) ABSTRACT

The present invention relates to a logic device using skyrmion, which comprises an input part; an output part; and an operation part located between the input part and the output part and includes at least one notch where the skyrmion can be annihilated, and in which the skyrmion moves from the input part to the output part by the applied current. The logic device provided in one aspect of the present invention consumes relatively little power, can have high integration, and has an effect of having a very simple structure compared to the conventional logic device by using the annihilation of skyrmion.

15 Claims, 17 Drawing Sheets

(56) References Cited

OTHER PUBLICATIONS

B. Liu et al., "An Efficient Racetrack Memory-Based Processing-in-Memory Architecture for Convolutional Neural Networks," 2017 IEEE International Symposium on Parallel and Distributed Processing with Applications and 2017 IEEE International Conference on Ubiquitous Computing and Communications (Year: 2017).*

Z. Zhou, U. Guin, P. Li and V. D. Agrawal, "Defect Characterization and Testing of Skyrmion-Based Logic Circuits," 2021 IEEE 39th VLSI Test Symposium (VTS), San Diego, CA, USA, 2021, pp. 1-7, doi: 10.1109/VTS50974.2021.9441054. (Year: 2021).*

M. Song, M. G. Park, S. Ko, S. K. Jang, M. Je and K.-J. Kim, "Logic Device Based on Skyrmion Annihilation," in IEEE Transactions on Electron Devices, vol. 68, No. 4, pp. 1939-1943, Apr. 2021, doi: 10.1109/TED.2021.3055157. (Year: 2021).*

Mak, Kai Yu. "Single-Bit Full Adder and Logic Gate Based on Synthetic Antiferromagnetic Bilayer Skyrmions—Rare Metals." SpringerLink, Nonferrous Metals Society of China, Apr. 20, 2022, link.springer.com/article/10.1007/s12598-022-01981-8. (Year: 2022).*

Xu, Min. "Reconfigurable Skyrmion Logic Gates with Auto-Annihilating Skyrmion Function." Iopscience.Iop.Org, 2023, iopscience.iop.org/. (Year: 2023).*

Luo, S. et al. Reconfigurable Skyrmion Logic Gates. Nano Lett 18, 1180-1184 (2018).

Liu, B. et al. in 2017 IEEE International Symposium on Parallel and Distributed Processing with Applications and 2017 IEEE International Conference on Ubiquitous Computing and Communications (ISPA/IUCC), 383-390 (2017).

* cited by examiner

LOGIC DEVICE USING SKYRMION

CROSS-REFERENCES TO RELATED APPLICATION

This patent application claims the benefit of priority from Korean Patent Application No. 10-2020-0060519, filed on May 20, 2020, and Korean Patent Application No. 10-2021-0003849, filed on Jan. 12, 2021, the contents of which are incorporated herein by reference.

BACKGROUND OF THE INVENTION

1. Field of the Invention

The present invention relates to a logic device using skyrmion.

2. Description of the Related Art

According to a report of SIA (Semiconductor Industry Association) released in 2015, by 2040, the energy required for computing is expected to exceed global energy production. It is inferred that the amount of global information is increasing exponentially, and the number of transistors for processing it also increases with the same trend, and thus the amount of power consumption of computing devices also increases exponentially. Now that artificial intelligence and big data are in the limelight, it is impossible to prevent the increase in data volume, and it will be very difficult to increase the world's energy production exponentially. Therefore, in order to prevent such prediction from becoming a reality, it is necessary to develop a low-power computing device with low power consumption per device. Under this necessity, attempts to develop computing devices that are superior to the conventional CMOS-based devices have been continued in the academic and industrial circles, and among them, computing using spin is attracting much attention.

If the spin of electrons is used, a low-power computing device can be implemented, and high performance can be expected in terms of magnetic memory compatibility. Representative spin-based computing devices include Spin-FET (Field Effect transistor), MJT (Magnetic Tunnel Junction), spin wave, and skyrmion-based devices. The advantages of these spin-based devices are as follows:

(1) Low power by spin: Heat generation, due to electron scattering can be minimized by replacing the transfer of charge with the transfer of spin moment.

(2) Low power by non-volatility: Spin-based devices are non-volatile in that information is retained even when power is turned off. Therefore, it is not necessary to maintain the power at ail times, and thus standby power consumption can be minimized.

(3) Logic in memory: The conventional computers have 'Von Neumann bottleneck' caused by the difference between the data processing speed of the computing device ($\sim 10^{-9}$ s) and the speed of loading data from the memory device to the computing device ($\sim 10^{-3}$ s). This can be overcome by using a logic-in-memory device in which a logic device is directly connected to the memory device. A spin-based computing device is a logic-in-memory device because it acts as a non-volatile memory by itself. Therefore, if a spin-based computing device is used, faster computing performance can be expected than the conventional computing methods.

(4) Compatibility with existing magnetic memory: Since the spin-based device has high compatibility with the conventional magnetic memory (MRAM, Magnetic Random Access Memory), the advantages of magnetic memory (high speed, non-volatile, low power) can be used at the same time.

Among them, when the skyrmion-based device using skyrmion is used as a computing device, it is very advantageous in terms of power consumption and integration. Therefore, in recent years, research has been conducted to implement the skyrmion-based device as a computing device.

PRIOR ART REFERENCE

Patent Reference

CN 107332554 A
CN 107846215 A

Non-Patent Reference

Luo, S. et al. Reconfigurable Skyrmion Logic Gates. *Nano Lett* 18, 1180-1184 (2018).

Liu, B. et al. in 2017 *IEEE International Symposium on Parallel and Distributed Processing with Applications and* 2017 *IEEE International Conference on Ubiquitous Computing and Communications (ISPA/IUCC)*, 383-390 (2017).

SUMMARY OF THE INVENTION

It is an object of the present invention to provide a logic device using the annihilation of skyrmion.

To achieve the above object, in one aspect of the present invention, the present invention provides a logic device using skyrmion, which comprises an input part; an output part; and an operation part located between the input part and the output part and includes at least one notch where the skyrmion can be annihilated, and in which the skyrmion moves from the input part to the output part by the applied current.

As an embodiment of the logic device, a half-adder comprising an input part where skyrmion can be input and includes two input terminals partitioned from each other; an operation part where the two input terminals extend and meet, including a notch in which the skyrmion can be annihilated by repulsion between the skyrmions on one side; and an output part that is connected to the operation part and includes two output terminals partitioned from each other to which the remaining skyrmion reaches by performing operations by the operation part, and in which the skyrmion moves from the input part to the output part by the applied current is provided.

At this time, as an embodiment of the half-adder, a half-adder in which the input part includes a first input terminal located on a first side of the two input terminals and a second input terminal located on an opposite side of the first side, the output part includes a first output terminal located on a first side of the two output terminals and a second output terminal located on an opposite side of the first side, a notch is located on the first side of the operation part, when a skyrmion is input to only one of the two input terminals, the skyrmion is preserved and moves to the first output terminal, when skyrmions are input to both of the two input terminals, two skyrmions repel each other in the operation part, one skyrmion disappears at the notch, and the other skyrmion moves to the second output terminal is provided.

As another embodiment of the logic device, a full-adder including a first half-adder, and a second half-adder made of the half-adder written above, which comprises an input part containing a first input terminal of the full-adder, connected to a first input terminal of the second half-adder, a second input terminal of the full-adder connected to a first input terminal of the first half-adder, and a third input terminal of the full-adder connected to a second input terminal of the first half-adder; a first operation part of the full-adder including the operation part of the first half-adder; a second operation part of the full-adder including the operation part of the second half-adder; and an output part containing a first output terminal of the full-adder connected to a first output terminal of the second half-adder and a second output terminal of the full-adder connected to a second output terminal of the second half-adder and a second output terminal of the first half-adder; wherein the first output terminal of the first half-adder is connected to the second input terminal of the second half-adder, and in which the skyrmion moves from the input part to the output part by the applied current is provided.

As another embodiment of the logic device, a logic device including the half-adder and one or more full-adders containing the first full-adder, which comprises a first input part including a first input terminal of the half-adder and a second input terminal of the half-adder; a second input part including a second input terminal of the first full-adder and a third input terminal of the first full-adder; and an output part including a first output terminal of the half-adder and a first output terminal of the first full-adder; wherein the second output terminal of the half-adder is connected to the first input terminal of the first full-adder, and in which the skyrmion moves from the input part to the output part by the applied current is provided.

At this time, as an embodiment of the logic device, a logic device including n full-adders, which comprises a first input part including a first input terminal of the half-adder and a second input terminal of the half-adder; a second input part including a second input terminal of the first full-adder and a third input terminal of the first full-adder; a third input part to a $n+1^{th}$ input part including a second input terminal and a third input terminal of each of the second full-adder to a $n^{th}$ full-adder; and an output part including a first output terminal of the half-adder, a first output terminal, of the first full-adder to a $n-1^{th}$ full-adder, a first output terminal of the $n^{th}$ full-adder and a second output terminal of the $n^{th}$ full-adder; wherein the second output terminal of a $k-1^{th}$ full-adder is connected to the first input terminal of a $k^{th}$ full-adder is provided ($2 \leq k \leq n$, n and k are natural numbers).

Advantageous Effect

The logic device provided in one aspect of the present invention consumes relatively little power, can have nigh integration, and has an effect of having a very simple structure compared to the conventional logic device by using the annihilation of skyrmion.

DESCRIPTION OF THE PREFERRED EMBODIMENTS

Figure 1:
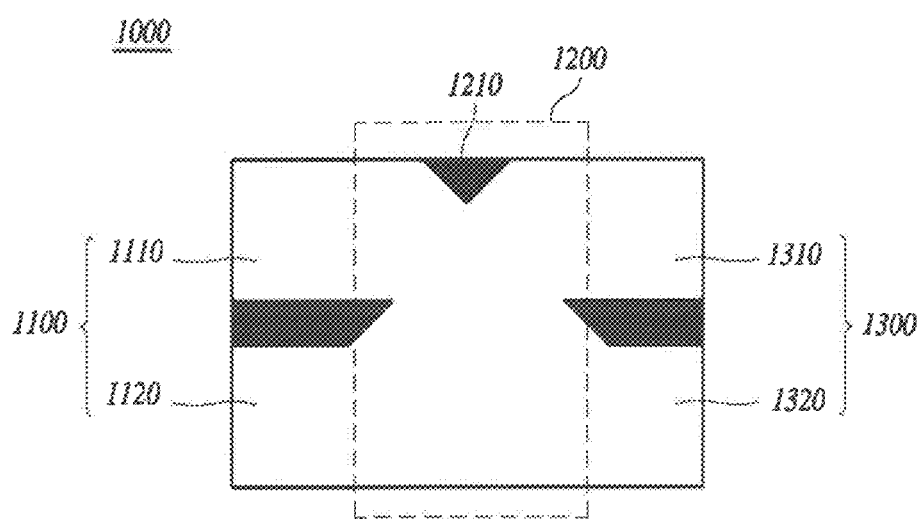
FIG. 1 is a schematic diagram illustrating the half-adder according to an embodiment of the present invention.

Advantages and features of the present invention, and a method of achieving the same will become apparent with reference to the embodiments described below in detail together with the accompanying drawings. However, the present invention is not limited to the embodiments disclosed below, but may be implemented in various different forms. The embodiments are provided only to make the disclosure of the present invention complete, and to fully inform the scope of the invention to those skilled in the art, and the present invention is defined by the scope of the claims. The same reference marks refer to the same elements throughout this specification.

The terms used in the present specification are for describing the embodiments, but not for limiting the present invention. In this specification, the singular form also includes the plural form unless specifically stated in the phrase. The terms "comprises" and/or "comprising" as used herein refer that the mentioned elements, steps, motions and/or devices do not exclude the presence or addition of one or more other elements, steps, motions and/or devices.

In addition, the embodiments described in the present specification will be described with reference to cross-sectional views and/or plan views, which are ideal exemplary diagrams of the present invention. Accordingly, the shape of the exemplary diagram may be modified by manufacturing technology and/or permissible error. Thus, the embodiments of the present invention are not limited to the specific form illustrated, but also include a change in form generated according to the manufacturing process. Accordingly, the regions illustrated in the drawings have rough properties, and the shapes of the regions illustrated in the drawings are for exemplifying the specific shape of the region of the device and are not intended to limit the scope of the invention.

The terms used in the embodiments of the present invention can be interpreted as meaning commonly known to those in the art, unless otherwise defined.

In the present specification, "connected" means that the skyrmion can move from one region to another region.

In one aspect of the present invention, the present invention provides a logic device using skyrmion, which comprises an input part; an output part; and an operation part located between the input part and the output part and includes at least one notch where the skyrmion can be annihilated, and in which the skyrmion moves from the input part to the output part by the applied current.

A skyrmion-based device uses a skyrmion as an information carrier. The skyrmion is a structure in which the spins of each point on a two-dimensional plane are arranged in a spiral shape. To be precise, when the spin direction vector of each point is mapped to a three-dimensional space, a spin structure that corresponds one-to-one to ail points on the spherical surface is called skyrmion. Skyrmion is a kind of magnetic singularity that can appear on a magnetic thin film, and because it has a circular boundary and a characteristic to maintain its structure, it can be said to be a kind of quasi-particle (behaving like a particle, but not a real particle).

By topological protection, the skyrmion inside the magnetic material is stable against a certain level of external stimulus and can be moved by electric current, so that a skyrmion-based device can be driven by electric current. In addition, the skyrmion exhibits a skyrmion Hall effect in which it bends and moves in a direction perpendicular to the direction of the applied current, and has a characteristic that it is selectively annihilated by the current at the physical boundary.

The advantages of the skyrmion-based computing device compared to the conventional spin-based computing device are as follows:

(1) It is advantageous in power consumption compared to MTJ-based computing devices because magnetization switching is not required except when generating/sensing skyrmion.

(2) Since skyrmion has a lower threshold current density for moving by electric current than that of the magnetic domain wall, it can be driven in a weaker power environment.

(3) Since skyrmion has a small size of about 1 nm to 100 nm in diameter at room temperature, the memory device can be made small, so that the skyrmion-based device is highly integrated.

The logic device provided in one aspect of the present invention can provide a new skyrmion-based logic device having a simple structure and can perform a complex function by using the annihilation of skyrmion.

First, the logic device provided in one aspect of the present invention comprises an input part, an output part, and an operation part.

Skyrmion can be input to the input part.

In the input part, an input value can be input according to the presence or absence of skyrmion.

The operation part is located between the input part and the output part.

The operation part includes at least one notch where skyrmion can be annihilated.

The skyrmion bends and moves in a direction perpendicular to the direction of the applied current. In general, when a spin rotates, a damping type rotation in a direction toward the rotation axis and a precession type rotation in a direction perpendicular to the rotation axis occur simultaneously. When the spin constituting skyrmion is rotated by the current applied through a magnetic layer, the damping type rotation makes the skyrmion move straight in a direction parallel to the current, and the precession type rotation makes the skyrmion bend in a direction perpendicular to the current. Therefore, the skyrmion moves parallel to the applied current direction and bends in a vertical direction at the same time. At this time, the angle of the skyrmion movement direction to the current direction depends on the ratio of the gyromagnetic ratio and the Gilbert damping constant of a material.

At this time, if one side of the operation part located in the direction in which the skyrmion is bent is defined as the first side, the notch is located on the first side of the operation part.

The skyrmion can be annihilated by repulsion between the skyrmions at the notch.

More specifically, when only one skyrmion is input to the operation part, the skyrmion is not annihilated, and when two skyrmions are input to the operation part, due to the repulsive force between the skyrmions, one skyrmion can be annihilated at the notch.

The skyrmion annihilation is described in more detail. Basically, the skyrmion inside the magnetic material is stable against a certain level of external stimuli. When the spin of a skyrmion is mapped in a three-dimensional space, it fills ail the areas of the sphere, so the skyrmion has a topological number of 1 or −1. Based on the principle that the topological number is preserved in an ideal spin system, there is an infinite energy barrier to annihilate the skyrmion existing inside the ideal magnetic material, and this is called topological protection. However, in an actual magnetic material, this energy barrier has a finite value due to the magnetization discontinuity at the material lattice structure or boundary, and thus, if a strong energy is given, the skyrmion may be annihilated. In other words, it is possible to intentionally annihilate the skyrmion through a special stimulus such as approaching the skyrmion to the boundary, but it is stable against ordinary physical shocks, weak magnetic fields, and thermal fluctuations at room temperature.

However, at the physical boundary of a magnetic material (edge of specimen), the energy distribution changes due to the magnetization discontinuity, and the skyrmion can be annihilated under certain conditions. One of these specific conditions is to apply high current to force the skyrmion to approach the boundary. When electric current is applied to the magnetic material in which skyrmion exists, the direction of movement is bent by skyrmion Hall effect, and the skyrmion approaches the physical boundary. At this time, the skyrmion and the boundary repulse each other, and at low current, the force that pushes the skyrmion toward the boundary and the skyrmion-boundary repulsion are in equilibrium so that the skyrmion moves stably. However, when high current is applied, the skyrmion becomes closer to the boundary under a certain distance, and the minimum energy point changes, and the skyrmion expands instantly, causing the skyrmion to be annihilated. Therefore, the skyrmion can be selectively preserved or annihilated by adjusting the current value. At this time, the minimum current density for annihilation of skyrmion is called the threshold current density of annihilation.

The shape of the notch is not limited to a specific one, but a structure in which skyrmion can be easily annihilated is preferable. In one example, the notch can have a pointed end, and more particularly, can include a triangular shape or a triangular shape having at least one side curve.

It is preferable that the current applied in the logic device is adjusted to the current density at which the skyrmion is not annihilated at other boundaries, is not annihilated at the notch when one skyrmion is input to the operation part, and can be annihilated at the notch only when two skyrmions are simultaneously input to the operation part and the skyrmions repel.

The skyrmion remaining as a result of the skyrmion behavior in the operation part can be output through the output part.

In the output part, an output value can be output according to the presence or absence of skyrmion.

In the logic device, the skyrmion can move from the input part to the output part by the applied current. In other words, when current is passed through a magnetic material in which skyrmion exists, the spins at each position rotate by the spin transfer torque or the spin orbit torque, and as a result, the skyrmion moves. This movement is not the actual movement of matter, but is a kind of domino effect as the spins of each position rotate in place. At this time, the moving speed of the skyrmion is proportional to the applied current density.

The logic device provided in one aspect of the present invention can include a nonmagnetic layer and a magnetic layer formed on the nonmagnetic layer.

The skyrmion and the notch can be located on the magnetic layer.

The current can be applied to the nonmagnetic layer.

The nonmagnetic layer can include at least one selected from the group consisting of nonmagnetic metals and topological insulators.

The nonmagnetic metal can be, for example, platinum (Pt), palladium (Pd), tantalum (Ta), titanium (Ti), tungsten (W) or gold (Au), but not always limited thereto.

The topological insulator can be, for example, $Bi_2Se_3$, $Bi_2Te_3$ or $Ag_2Te_3$, but not always limited thereto.

The magnetic layer can include at least one selected from the group consisting of ferromagnetic substances and ferrimagnetic substances.

The ferromagnetic substance includes both metals and non-metals, conductors and non-conductors, and can be, for example, cobalt (Co), iron (Fe), nickel (Ni), and alloys thereof, but not always limited thereto.

The ferrimagnetic substance includes both metals and non-metals, conductors and non-conductors, and can be, for example, TbCo, TbFe, GdCo, GdFe, GdFeCo, $Fe_3O_4$, YIG (yttrium iron garnet), TmIG or TbIG, but not always limited thereto.

The logic device provided in one aspect of the present invention can further include a timing notch capable of controlling the movement of the skyrmion.

If one side of the device positioned in the direction in which the skyrmion is curved is defined as the first side, the timing notch can be located at a position opposite to the first side.

That is, the skyrmion can be located in a direction opposite to the direction in which the skyrmion is bent due to skyrmion Hall effect, and as a result, annihilation of the skyrmion may be difficult in the timing notch.

The timing notch can be located at various positions, such as an input part, an operation part, and an output part, as needed.

The timing notch can play a role of controlling the movement timing of the skyrmion existing in the logic device.

The timing notch can prevent the skyrmion from moving when current below a specific value is applied.

In more detail, when the skyrmion is positioned in front of the timing notch, the skyrmion may be stopped, and when relatively high current is momentarily applied, the skyrmion can move through the timing notch.

That is, when the skyrmion is to be stopped in front of the timing notch, relatively low current is applied, and when the skyrmion is to be moved, the current density can be adjusted to apply relatively high current.

As an embodiment of the logic device, a half-adder comprising an input part where skyrmion can be input and includes two input terminals partitioned from each other; an operation part including a notch in which the two input terminals extend and meet, and the skyrmion can be annihilated by repulsion between the skyrmions on one side; and an output part that is connected to the operation part and includes two output terminals partitioned from each other to which the remaining skyrmion reaches by performing operations by the operation part, and in which the skyrmion moves from the input part to the output part by the applied current is provided.

Herein, since the half-adder is an embodiment of the logic device, ail the details described above for the logic device can be applied.

As described above, the notch can be located on the first side of the operation part positioned in the direction in which the skyrmion is bent by the skyrmion Hall effect.

The meaning of being partitioned in the input part and the output part may mean a state in which the skyrmion cannot pass through each input terminal and output terminal, but is not limited to a specific form.

The meaning that the two input terminals are extended and meet in the operation part means that each partitioned input terminal forms a channel through which the skyrmion can move and is extended, and it can mean that each channel meets in the operation part and is connected so that the skyrmions can meet each other, but is not limited to a specific form.

In one specific embodiment, the input part can include a first input terminal located on a first side of the two input terminals and a second input terminal located on an opposite side of the first side, and the output part can include a first output terminal located on a first side of the two output terminals and a second output terminal located on an opposite side of the first side.

When a skyrmion is input to only one of the two input terminals, the skyrmion is preserved and can be moved to the first output terminal.

When skyrmions are input to both input terminals, two skyrmions are repelled each other in the operation part, one skyrmion is annihilated at the notch, and the other, skyrmion can be moved to the second output terminal.

The first output terminal may function as an XOR gate, and the second output terminal may function as an AND gate.

The first output terminal may output a sum signal, and the second output terminal may output a carry signal.

The half-adder can include a nonmagnetic layer and a magnetic layer formed on the nonmagnetic layer.

The skyrmion and the notch can be located on the magnetic layer.

The current can be applied to the nonmagnetic layer.

The nonmagnetic layer can include at least one selected from the group consisting of nonmagnetic metals and topological insulators.

The magnetic layer can include at least one selected from the group consisting of ferromagnetic substances and ferrimagnetic substances.

The half-adder can further include a timing notch capable of controlling the movement of the skyrmion.

As another embodiment of the logic device, a full-adder including a first half-adder and a second half-adder made of the half-adder written above, which comprises an input part in which the first output terminal of the first half-adder is connected to the second input terminal of the second half-adder and containing a first input terminal of the full-adder connected to the first input terminal of the second half-adder, a second input terminal of the full-adder connected to the first input terminal of the first half-adder, and a third input terminal of the full-adder connected to the second input: terminal of the first half-adder; a first operation part of the full-adder including the operation part of the first half-adder; a second operation part of the full-adder including the operation part of the second half-adder; and an output part containing a first output terminal of the full-adder connected to the first output terminal of the second half-adder and the second output terminal of the second half-adder and a second output terminal of the full-adder connected to the second output terminal of the first half-adder; and in which the skyrmion moves from the input part to the output part by the applied current is provided.

Herein, since the full-adder is an embodiment of the logic device, all of the above descriptions for the logic device can be applied.

In the full-adder, the first input terminal can input a carry signal, the first output terminal of the full-adder can output a sum signal, and the second output terminal of the full-adder can output a carry signal.

As another embodiment of the logic device, a logic device including the half-adder and one or more full-adders containing the first full-adder, which comprises a first input part including a first input terminal of the half-adder and a second input terminal of the half-adder, in which the second output terminal of the half-adder is connected to the first input terminal of the first full-adder; a second input part including a second input terminal of the first full-adder and a third input terminal of the first full-adder; and an output part including a first output terminal of the half-adder and a first output terminal of the first full-adder; and in which the skyrmion moves from the input part to the output part by the applied current is provided.

Herein, since the logic device is an embodiment of the logic device, all of the above descriptions for the logic device can be applied.

The second output terminal of the half-adder can transmit a carry signal to the first input terminal of the first full-adder.

The output part can further include an additional output terminal in addition to the first output terminal of the half-adder and the first output terminal of the first full-adder.

For example, in an embodiment of the present invention, when the logic device includes one half-adder and one full-adder, the second output terminal of the half-adder is connected to the first input terminal of the full-adder, the first input part includes a first input terminal of the half-adder and a second input terminal of the half-adder, the second input part includes a second input terminal of the full-adder and a third input terminal of the full-adder, and the output part can include a first, output terminal of the half-adder, a first output terminal of the full-adder and a second output terminal of the full-adder.

As an embodiment of the logic device, a logic device including n full-adders in which the second output terminal of the $k-1^{th}$ full-adder is connected to the first input terminal of the $k^{th}$ full-adder, which comprises a first input part including a first input terminal of the half-adder and a second input terminal of the half-adder; a second input part including a second input terminal of the first full-adder and a third input terminal of the first full-adder; a third input part to $n+1^{th}$ input part including a second input terminal and a third input terminal of each of the second full-adder to the $n^{th}$ full-adder; and an output part including a first output terminal of the half-adder, a first output terminal of the first full-adder to the $n-1^{th}$ full-adder, a first outpour, terminal of the $n^{th}$ full-adder and a second output terminal of the $n^{th}$ full-adder is provided ($2 \leq k \leq n$, n and k are natural numbers).

At this time, the second output terminal of the half-adder transmits a carry signal to the first input terminal of the first full-adder, and the second output terminal of the $k-1^{th}$ full-adder can transmit the first input terminal of the $k^{th}$ full-adder.

For example, in an embodiment of the present invention, when the logic device includes one half-adder and two full-adders, the second output terminal on the half-adder is connected to the first input terminal of the first full-adder, and the second output terminal of the first full-adder can be connected to the first input terminal of the second full-adder.

In addition, the first input part includes a first input terminal of the half-adder and a second input terminal of the half-adder, the second input part includes a second input terminal of the first full-adder and a third input terminal of the full-adder, and the third input part includes a second input terminal of the second full-adder and a third input terminal of the second full-adder.

In addition, the output part can include a first output terminal of the half-adder, a first output terminal of the first full-adder, a first output terminal of the second full-adder, and a second output terminal of the second full-adder.

As such, the logic device can be configured by continuously connecting the half-adder and the full-adder.

At this time, the part to which the second output terminal of the $k-1^{th}$ full-adder and the first input terminal of the $k^{th}$ full-adder are connected can be used without limitation as long as the shape is easily connected.

Figure 7:
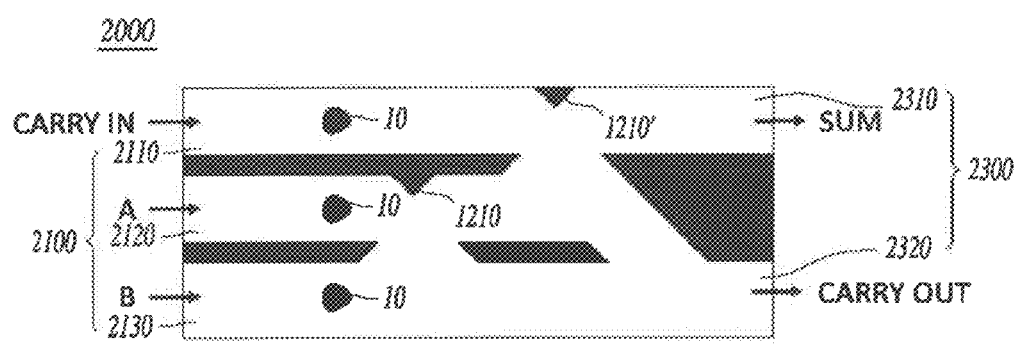
FIG. 7 is a schematic diagram illustrating the modified example of the full-adder according to another embodiment of the present invention.
Figure 11:
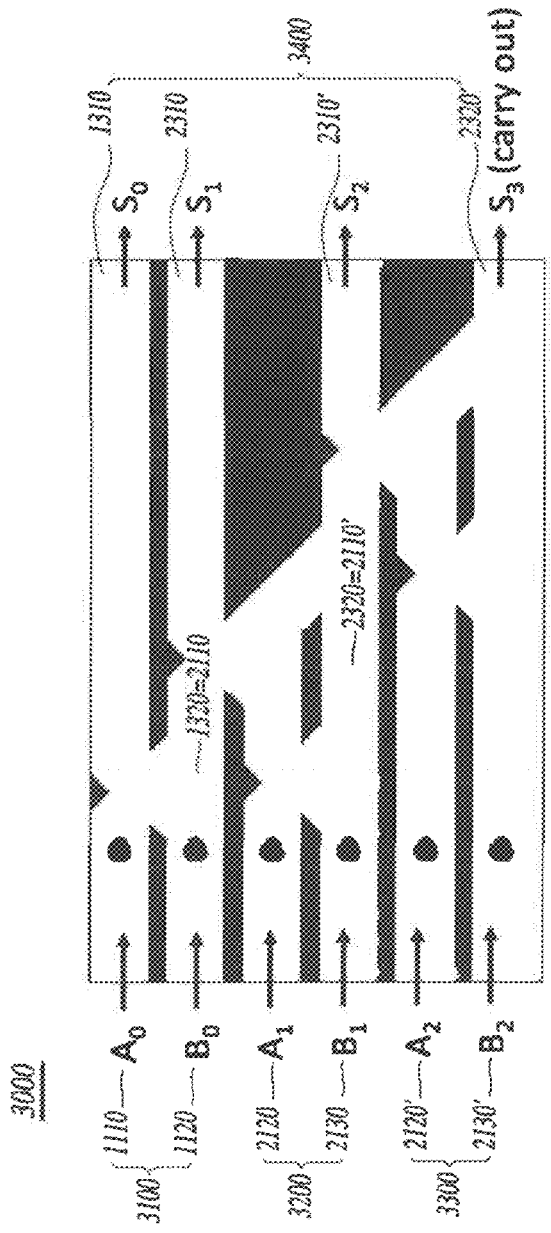
FIG. 11 is a schematic diagram illustrating the 3-bit adder according to another embodiment of the present invention.

In an embodiment of the present invention, as shown in FIGS. 7 and 11, the part to which the second output terminal of the $k-1^{th}$ full-adder and the first input terminal of the $k^{th}$ full-adder are connected can be formed to be inclined downward according to the direction, but not always limited thereto.

The structures such as the above-described logic devices can be prepared by patterning the magnetic layer by electron beam lithography.

In the input part, the skyrmion may be generated by laser focusing or applying voltage to the MTJ structure.

In the output part, the skyrmion can be detected by measuring the voltage by installing the MTJ structure in a vertical direction.

The logic devices provided in the present invention have advantages in that they can be driven at the lower current than other spin-based devices and thus can be made with a small size. In addition, a skyrmion-based logic device having a simpler structure can be implemented by using the annihilation of skyrmion, which was not previously considered.

Therefore, a half-adder with XOR/AND parallel gate structure can be implemented, a skyrmion full-adder can be implemented by connecting a half-adder, and a 2-bit adder connecting a skyrmion half-adder and a full-adder can be implemented.

Further, it is possible to prepare an arbitrary n-bit adder by repeating the same method.

In addition, since the logic device provided by the present invention does not require an initialization process, it has advantages in terms of manufacturing and use.

Hereinafter, the present invention will be described in detail by the following examples.

However, it will be appreciated that those skilled in the art, on consideration of this disclosure, may make modifications and improvements within the spirit and scope of the present invention.

Example 1: Implementation of Half-Adder

It is assumed that the skyrmion is moving due to spin-orbit torque (SOT) by applying current to the heavy metal layer of a sample of a ferromagnetic substance/heavy metal heterojunction structure. At this time, the equation governing the time change of the magnetization m at each point is given by the following LLG (Landau-Lifshitz-Gilbert) equation (Mathematical Formula 1).

$$\frac{dm}{dt} = -|\gamma| m \times H_{eff} + \alpha \left( m \times \frac{dm}{dt} \right) + |\gamma| \beta \epsilon (m \times m_p \times m)$$

(Mathematical Formula 1)

$\gamma$ is gyromagnetic ratio, $H_{eff}$ is effective magnetic field, $\alpha$ is Gilbert damping constant, $$\beta = \left| \frac{\hbar}{\mu_0 e} \right| \left| \frac{j}{M_s d} \right|, \epsilon = \frac{P}{2},$$

and P are spin polarizations. The last term on the right side is the term Slonczewski's spin transfer torque, indicating the SOT effect by current. Unless otherwise noted, the applied current density is $j=3.3 \times 10^{10}$ A/m$^2$, and the injection spin vector is $m_p = -\hat{y}$.

As a material, a platinum-cobalt (Pt/Co) heterojunction structure was assumed, and the material values are given as in the following table.

TABLE 1

| Mark | Value |
| --- | --- |
| $M_s$ (Saturation magnetisation) | $5.8 \times 10^5$ A/m |
| A (Exchange stiffness) | $1.5 \times 10^{-11}$ J/m |
| KU (Uniaxial anisotropy constant) | $8 \times 10^5$ J/m$^3$ |
| $\alpha$ (Gilbert damping constant) | 0.5 |
| $D_{ind}$ (Interfacial Dzyaloshinskii-Moriya interaction (DMI) constant) | $3.5 \times 10^{-3}$ J/m$^2$ |

As shown in FIG. 1, a half-adder as shown in FIG. 1 was implemented by forming a notch in a triangular shape. The current density was set to $3.3 \times 10^{10}$ A/m$^2$.

As shown in FIG. 1, the first input terminal (1110) is located at the top of the input part (1100) of the half-adder (1000) of Example 1, the second input terminal (1120) of the half-adder is located at the bottom, the notch (1210) is located at the top of the operation part (1200), and the first output terminal (1310) is located at the top of the output part (1300) and the second output terminal (1320) is located at the bottom.

Figure 2:
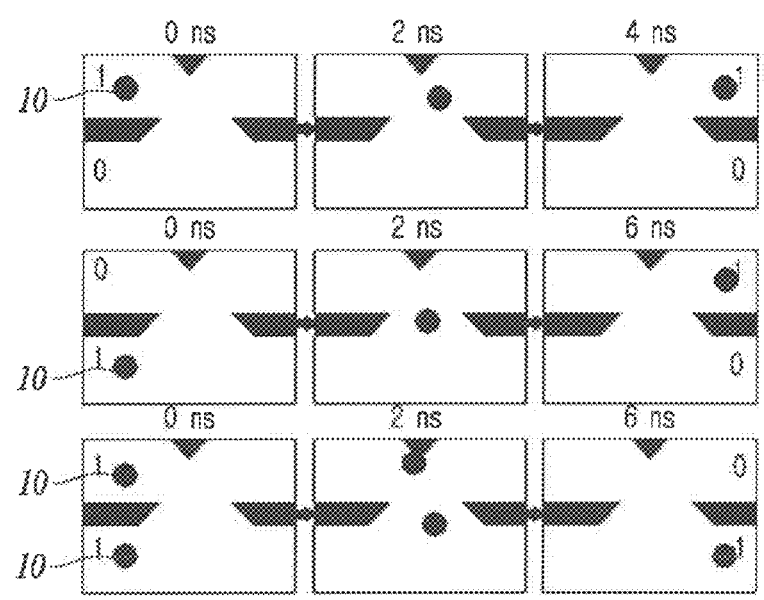
FIG. 2 is a diagram illustrating the results of computational simulation for driving the half-adder according to an embodiment of the present invention.

As shown in FIG. 2, when the input of (1,1) is applied, the skyrmion (10) raised from the bottom pushes the upper skyrmion (10) to the vertex of the triangle to be annihilated, and the skyrmion raised from the bottom descends again. The results of the input in four possible cases are shown in the truth table below (FIG. 2 and Table 2).

TABLE 2

| A | B | XOR | AND |
| --- | --- | --- | --- |
| 0 | 0 | 0 | 0 |
| 0 | 1 | 1 | 0 |
| 1 | 0 | 1 | 0 |
| 1 | 1 | 0 | 1 |

Figure 3:
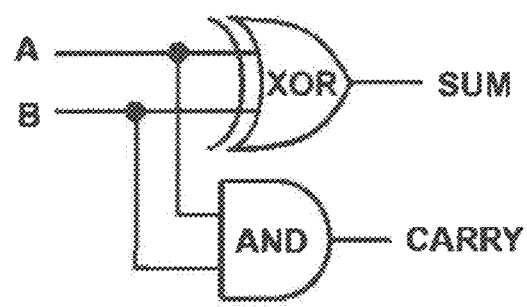
FIG. 3 is a diagram illustrating the half-adder according to an embodiment of the present invention as an XOR gate and an AND gate.

That is, in the device of FIG. 1, the upper output becomes an XOR gate, and the lower output becomes an AND gate. Since the parallel connection between the XOR gate and the AND gate is a half-adder circuit as shown in FIG. 3, the device shown in FIGS. 1 and 2 can act as a half-adder device in which the upper output is SUM and the lower output is CARRY (carry digit). That is, when each result is substituted by addition, it becomes '1+0=1', '0+1=1', '1+1=0 (sum) and carry 1', as shown in FIG. 2 and Table 2.

Example 2: Implementation of Full-Adder

Figure 4:
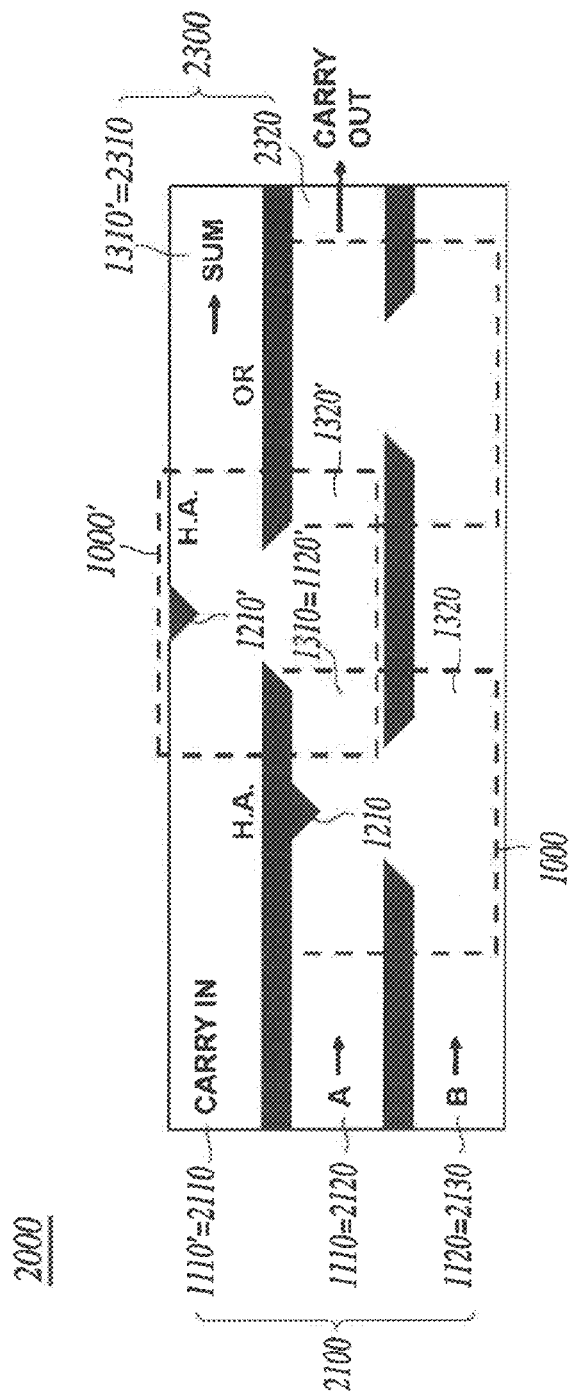
FIG. 4 is a schematic diagram illustrating the full-adder according to another embodiment of the present invention.
Figure 6:
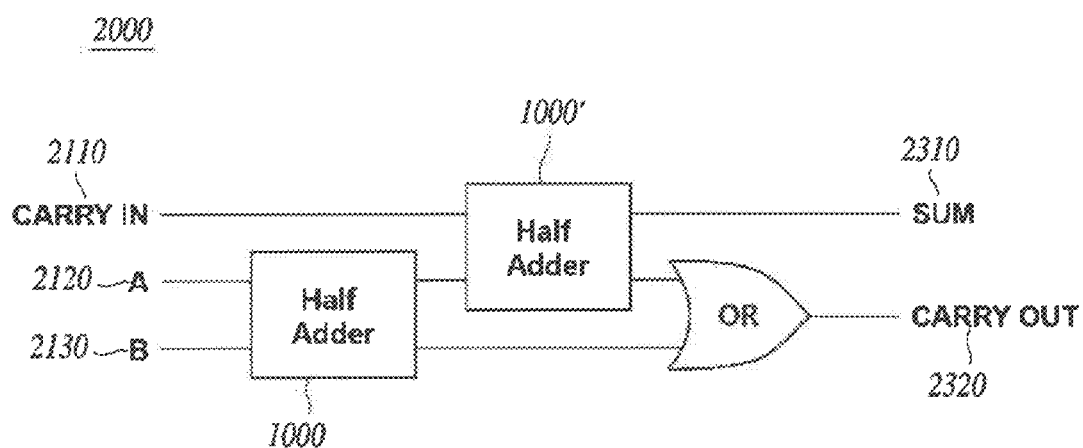
FIG. 6 is a diagram illustrating the full-adder according to another embodiment of the present invention as half-adders and an OR gate.

A full-adder can consist of the sum of two half-adders and an OR gate (FIG. 6). That is, if two skyrmion half-adders and one skyrmion OR device of Example 1 are connected, a full-adder, device can be configured. FIG. 4 shows a skyrmion full-adder device designed based on this. At this time, two half-adders and one OR gate were connected within a magnetic material, allowing the skyrmion to move directly between them to transmit a signal. In this case, since there is no case where both inputs of the OR gate are 1, the notch was removed to simplify the structure. The path at the bottom right is not an output terminal and in any case the skyrmion does not reach this side.

That is, the full-adder (2000) of Example 2 includes the first half-adder (1000) of Example 1 and the second half-adder (1000') of Example 1.

The first input terminal (2110) of the full-adder of FIG. 4 is the same as the first input terminal (1110') of the second half-adder, the second input terminal (2120) of the full-adder is the same as the first input terminal (1110) of the first half-adder, and the third input terminal (2130) of the full-adder is the same as the second input terminal (1120) of the first half-adder.

In addition, in the full-adder of Example 2, the first output terminal (1310) of the first half-adder is the same as the second input terminal (1120') of the second half-adder.

Further, the first output terminal (2310) of the full-adder of Example 2 is the same as the first output terminal (1310') of the second half-adder, and the second output terminal (2320) is connected to the second output terminal (1320') of the second half-adder and the second output terminal (1320) of the first half-adder.

Figure 5:
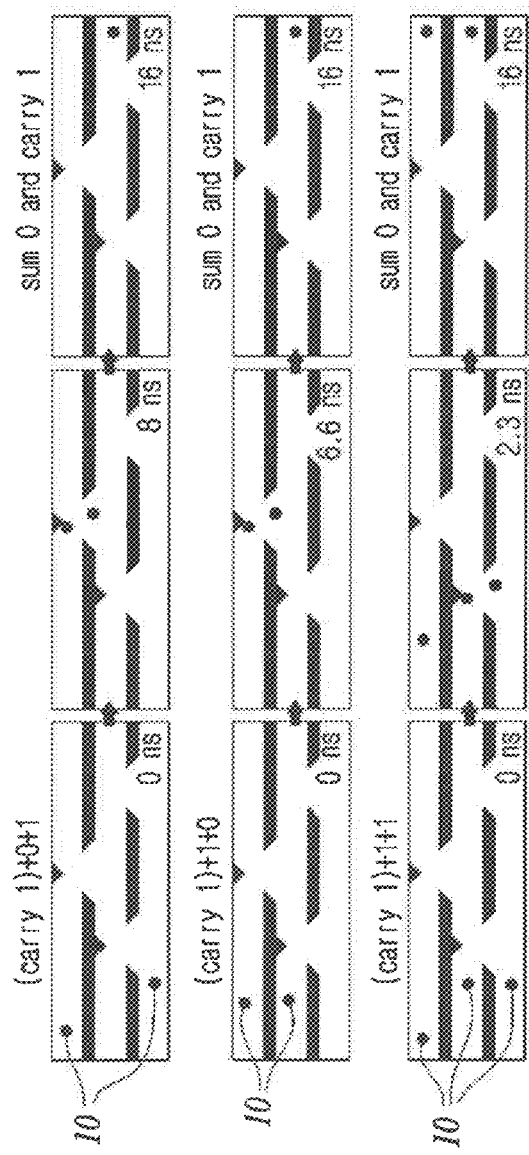
FIG. 5 is a diagram illustrating the results of computational simulation for driving the full-adder according to another embodiment of the present invention.

FIG. 5 shows the results of computational simulation for driving the skyrmion full-adder. When the input carry was 0, it was the same as the half-adder, so only when the input carry was 1 is shown. In this case, the results consistent with the truth table of the full-adder (Table 3) appeared, indicating that the operation works well, and it was confirmed that the function of the full-adder was normally performed for the other input cases.

TABLE 3

| $C_{in}$ | A | B | Sum | $C_{out}$ |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 0 | 1 |
| 1 | 0 | 1 | 0 | 1 |
| 1 | 1 | 0 | 0 | 1 |
| 1 | 1 | 1 | 1 | 1 |

In addition, in order to facilitate the connection with other full-adders in the future, the path at the bottom right where the skyrmion does not reach was removed, and the wall near the second output terminal of the full-adder was formed at an angle as shown in FIG. 7 so that the $C_{out}$ value can be output from the bottom.

In this case, the size could be reduced from 620 nm×220 nm to 540 nm×220 nm.

Example 3: Implementation of Half-Adder+Full-Adder (2-Bit Adder)

Figure 10:
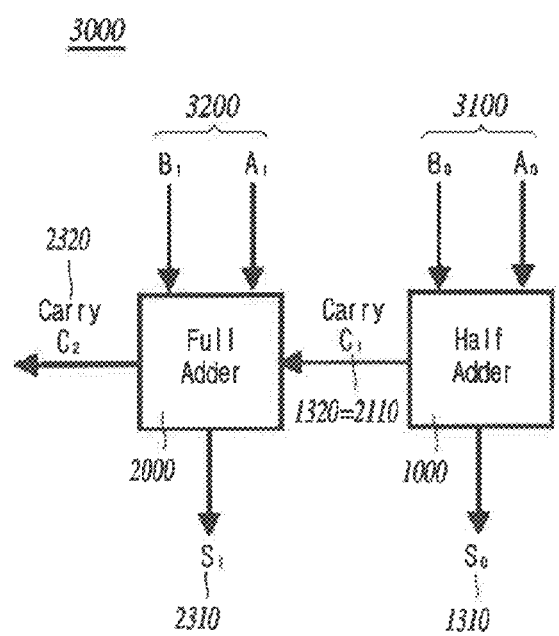
FIG. 10 is a diagram illustrating the 2-bit adder according to another embodiment of the present invention as a half-adder and a full-adder.

To add two numbers with multiple bits, the connection between single adders is required. A basic ripple-carry adder, starts with the half-adder and adds the first digits of the two numbers to add, outputs the sum, passes the carry to the next full-adder, and then outputs the sum again, and passes the carry to the next full-adder (FIG. 10). In order to apply this method to the skyrmion adder device, it is necessary to confirm whether the connection of single adders is possible. For this, it was confirmed whether the connection between the skyrmion half-adder and the full-adder proposed above is possible.

Figure 8:
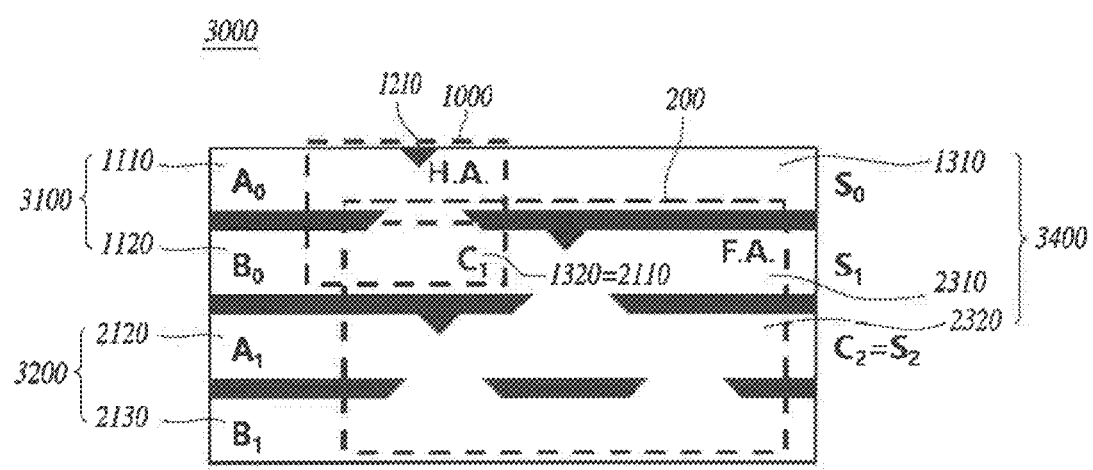
FIG. 8 is a schematic diagram illustrating the 2-bit adder according to another embodiment of the present invention.

FIG. 8 shows the structure of a 2-bit skyrmion adder configured by directly connecting a skyrmion half-adder and a full-adder.

More particularly, the 2-bit skyrmion adder (3000) of Example 3 includes a half-adder (1000) and a full-adder (2000).

The first input part (3100) of the adder of Example 3 (3000) includes a first input terminal (1110) and a second input terminal (1120) of the half-adder, and the second input part (3200) of the adder includes a second input terminal (2120) of the full-adder and a third input terminal (2130) of the full-adder.

In the adder (3000), the second output terminal (1320) of the half-adder is connected to the first input terminal (2110) of the full-adder.

The output part (3400) of the adder (3000) includes a first output terminal (1310) of the half-adder, a first output terminal (2310) of the full-adder, and a second output terminal (2320) of the full-adder.

The first digits $A_0$ and $E_0$ of each of the two inputs A and B are first input to the half-adder. Then, $S_0$, the sum, is moved to the output terminal, end $C_1$, the carry, is moved to the next full-adder. Thereafter, $C_1$ and the second digits $A_1$ and $B_1$ of A and B are input to the full-adder, and as a result, $S_1$ and $C_2$ are respectively output from the output terminal. At this time, the last output $C_2$ is equal to $S_2$, the last digit of the sum of A and B.

Figure 9:
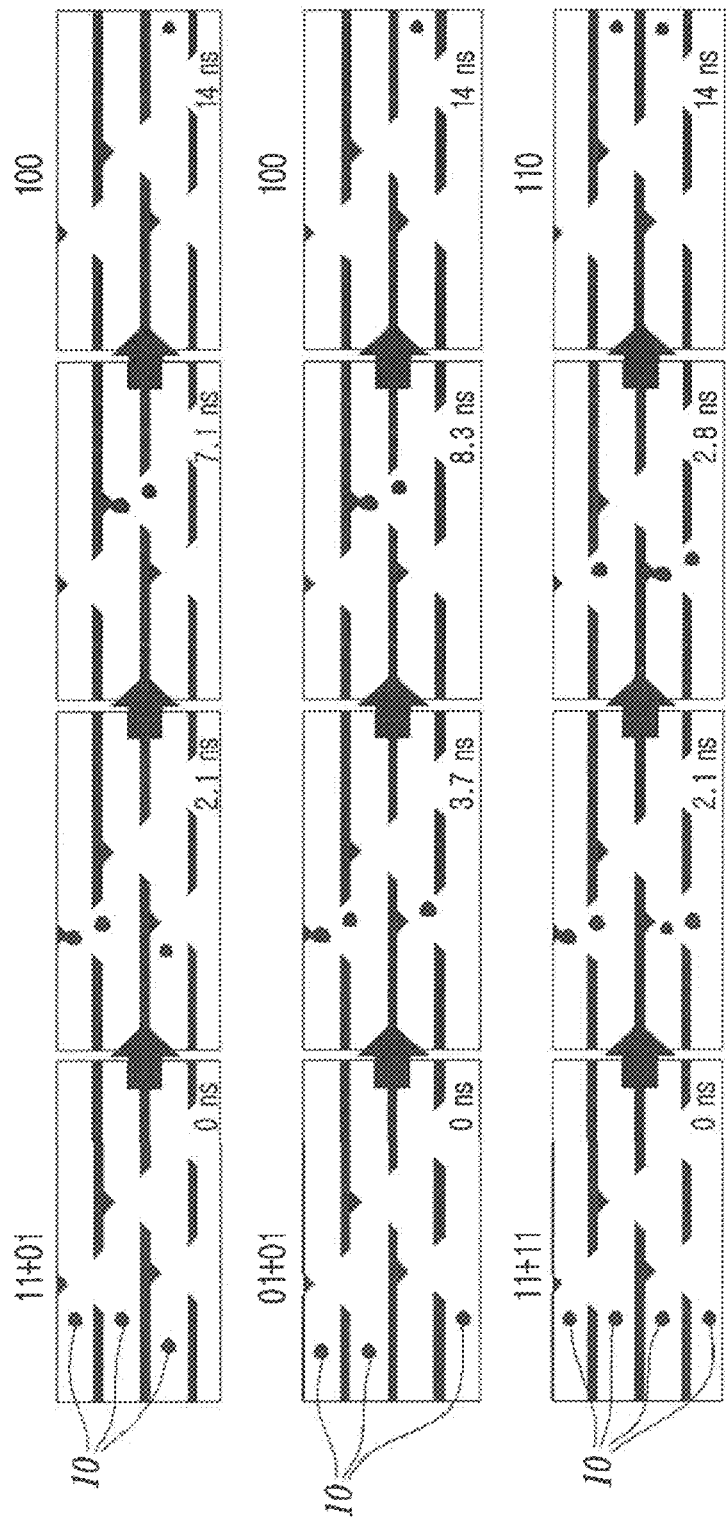
FIG. 9 is a diagram illustrating the results of computational simulation for driving the 2-bit adder according to another embodiment of the present invention.

FIG. 9 shows the results of computational simulation for driving the 2-bit skyrmion adder. When the output carry $C_1$ of the half-adder is 0, it is the same as one of the full-adders, so only the case where $C_1$ is 1 is shown. In each case, it can be seen that the addition of $A_1A_0+B_1B_0=S_2S_1S_0$ is successfully performed. In addition, if one more adder is connected in the same way, it will be a 3-bit adder, and if one more adder is connected, it will be a 4-bit adder, so it is possible to implement an arbitrary n-bit adder.

Example 4: Implementation of Half-Adder+Full-Adder+Full-Adder (3-Bit Adder)

FIG. 11 shows a 3-bit skyrmion adder in which one more full-adder is added to the adder of Example 3. As mentioned in Example 2, in order to facilitate the connection with other full-adders, the path at the bottom right where the skyrmion does not roach was removed, and the walls near the second output terminals of the first full-adder and the second full-adder were formed at an angle as shown in FIGS. 7 and 11 so that the $C_{out}$ value can be output from the bottom. The size was 760 nm×460 nm.

Figure 13:
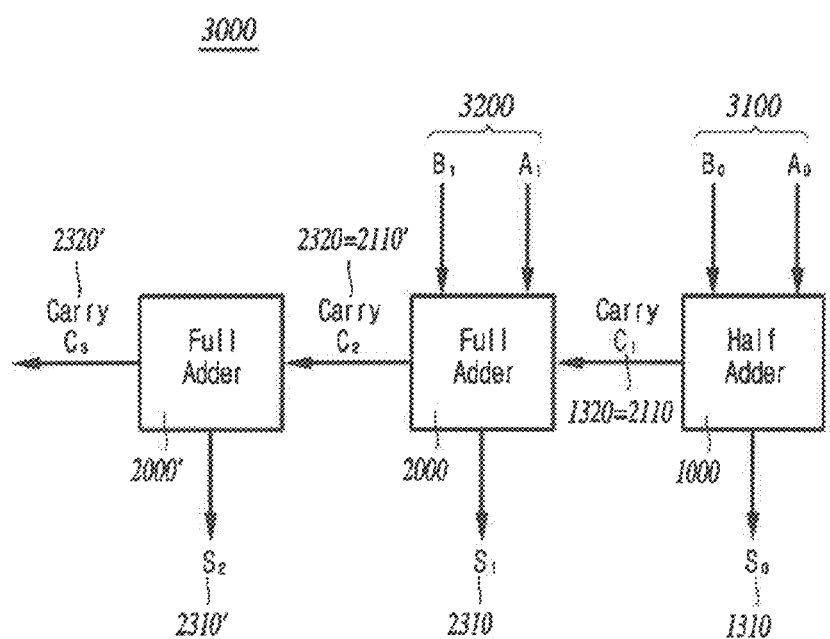
FIG. 13 is a diagram illustrating the 3-bit adder according to another embodiment of the present invention as a half-adder and full-adders.

The adder (3000) includes a half-adder (1000), a first full-adder (2000), and a second full-adder (2000') (FIG. 13).

The second output terminal (1320) of the half-adder is connected to the first input terminal (2110) of the first full-adder (2000).

The second output terminal (2320) of the first full-adder is connected to the first input terminal (2110') of the second full-adder.

The first input part (3100) of the adder includes a first input terminal (1110) and a second input terminal (1120) of the half-adder.

The second input part (3200) of the adder includes a second input terminal (2120) and a third input terminal (2130) of the first full-adder.

The third input part (3300) of the adder includes a second input terminal (2120') and a third input terminal (2130') of the second full-adder.

The output part (3400) of the adder includes a first output terminal (1310) of the half-adder, a first output terminal (2310) of the first full-adder, a first output terminal (2310') of the second full-adder, and a second output terminal (2320') of the second full-adder (FIG. 11).

Figure 12:
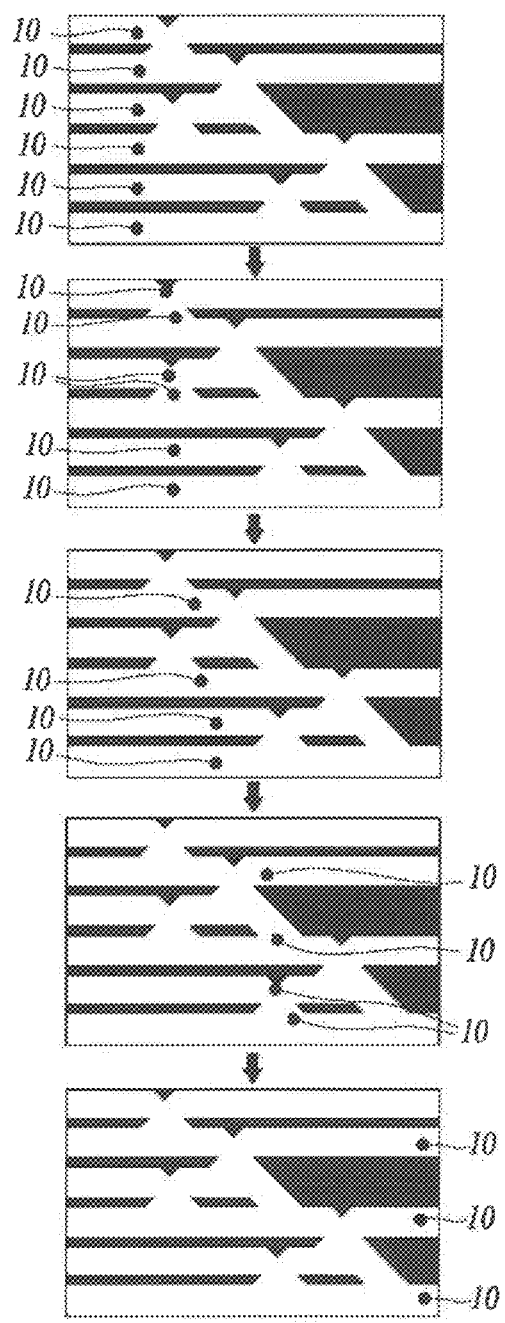
FIG. 12 is a diagram illustrating the results of computational simulation for driving the 3-bit adder according to another embodiment of the present invention.

As a result of calculating 111+111 as an example in FIG. 12, it was confirmed that the operation worked well as 111+111=1110.

Example 5: Formation of Timing Notch

In Examples 1 to 4, it was confirmed that a half-adder, a full-adder, and a sum thereof can be implemented using the annihilation of a skyrmion.

However, as more adders are connected, the problem of controlling the movement timing of the skyrmion becomes more important.

Figure 14:
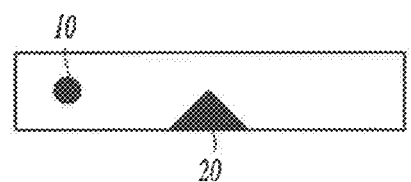
FIG. 14 is a schematic diagram illustrating the timing notch that can be used in an embodiment of the present invention.

For this reason, in order to more easily control the movement timing of the skyrmion, a timing notch (20) can be further included on the opposite side of the surface where the notches (1210, 1210', etc.) for the skyrmion annihilation exist, that is, on the lower side as shown in FIG. 14.

Figure 15:
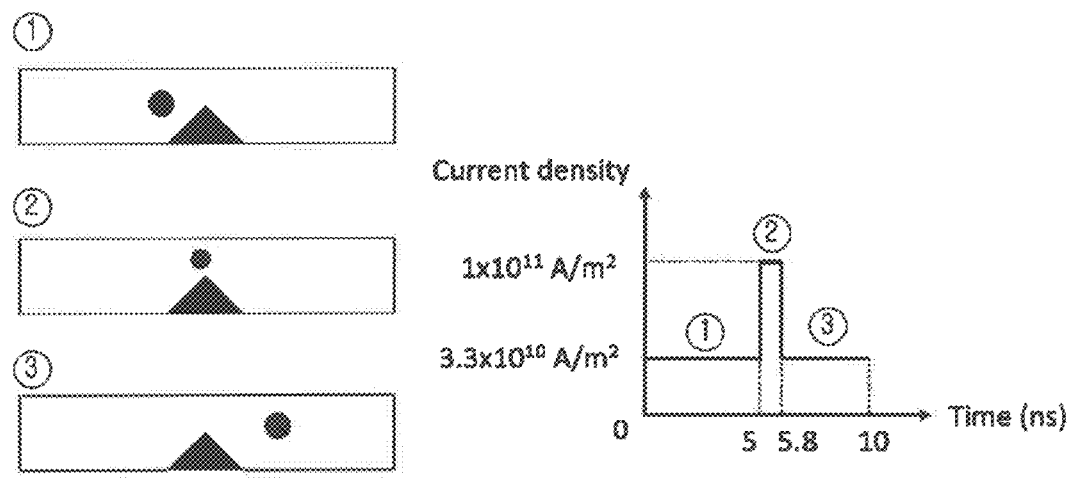
FIG. 15 is a diagram illustrating the behavior of skyrmion according to current density in the timing notch that can be used in an embodiment of the present-invention.

As shown in FIG. 15, it was confirmed that the skyrmion was caught by the timing notch and the skyrmion stopped at the current density below a certain value, and the skyrmion could go over the timing notch when the current density above a certain value was applied instantaneously.

Such timing notches can be applied to the logic devices of Examples 1 to 4 as shown in FIG. 15.

Experimental Example 1: Parallel Operation

Using the 3-bit skyrmion adder of Example 4, 7+7, 6+6, 6+7, and 6+3 were sequentially calculated.

Figure 16:
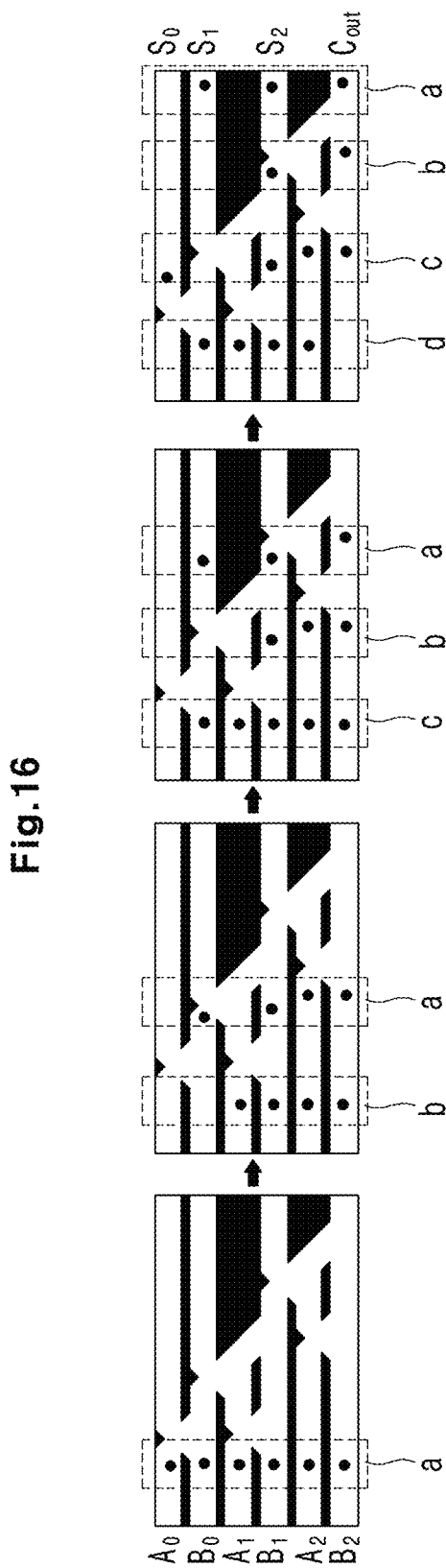
FIG. 16 is a diagram illustrating the results of performing a plurality of operations in parallel in the skyrmion adder according to an embodiment of the present invention in an experimental example of the present invention.

The results can be confirmed in FIG. 16, wherein each box represents the operation of 7(111)+7(111) ((a)), the operation of 6(110)+6(110) ((b)), the operation of 6(110)+7(111) ((c)), and the operation of 6(110)+3(011) ((d)) in order from the right, based on the rightmost diagram. As shown in FIG. 16, it was confirmed that the 3-bit skyrmion adder of Example 4 was able to calculate simultaneously even if the next input was applied before one input was ail calculated. Therefore, it can be seen that a remarkable improvement can also be made in terms of operation speed.

Experimental Example 2: Evaluation of Power Consumption of n-Bit Skyrmion Adder An n-bit skyrmion adder was implemented by applying the adders of Examples 1 to 4. The power consumption of this adder was calculated and compared with the power consumption of the general wire-connected adder, and the adder suggested in a reference (Luo, S. et al. Reconfigurable Skyrmion Logic Gates. Nano Lett 18, 1180-1184 (2018)).

Figure 17:
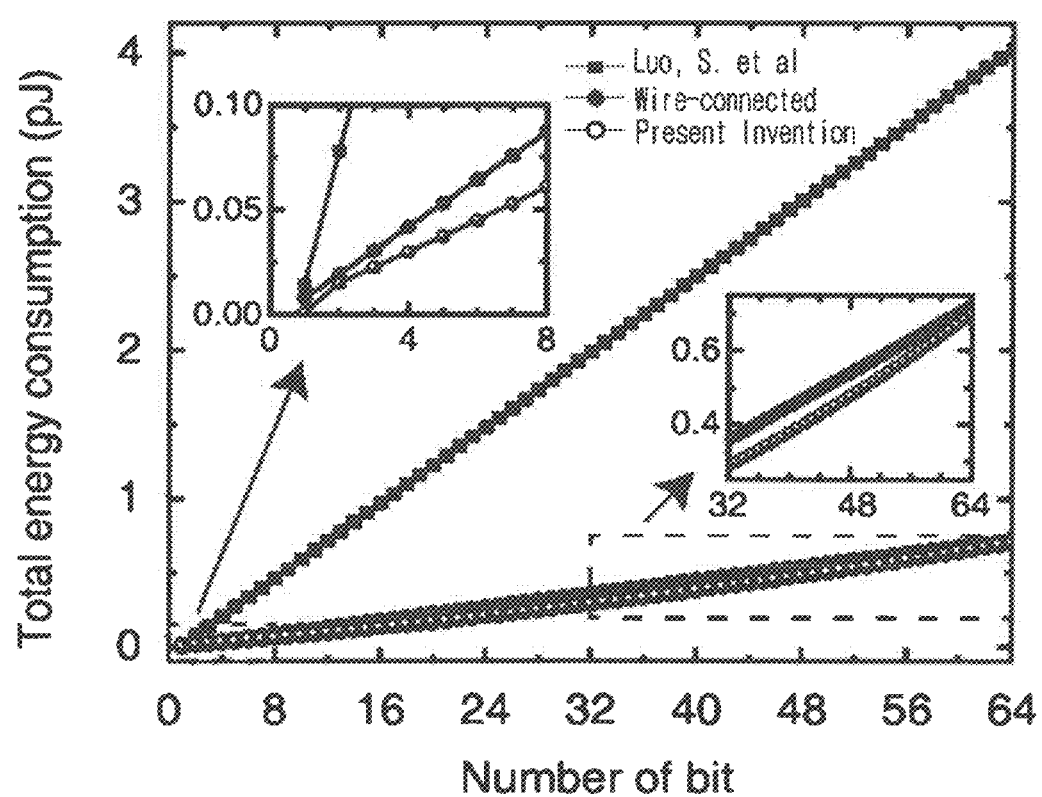
FIG. 17 is a graph illustrating the power consumption of the skyrmion adder according to an embodiment of the present invention in an experimental example of the present invention.

As a result, as shown in FIG. 17, it was confirmed that the n-bit skyrmion adder according to an embodiment of the present invention not only showed significantly lower power consumption compared to the adder suggested in a reference (Luo, S. et al. Reconfigurable Skyrmion Logic Gates. Nano Lett 18, 1180-1184 (2018)), but also showed lower power consumption compared to the wire-connected adder.

In particular, on a 32-bit basis, the skyrmion adder according to an embodiment of the present invention was capable of driving while consuming only 15% of power compared to the adder suggested in a reference (Luo, S. et al. Reconfigurable Skyrmion Logic Gates. Nano Lett 18, 1180-1134 (2018)).

In addition, it was confirmed that the structure of the n-bit skyrmion adder according to an embodiment of the present invention was significantly simpler than that of the wire-connected adder, and the power consumption for driving was also low.

That is, the n-bit skyrmion adder according to an embodiment of the present invention has the advantages of having a simple structure and very low power consumption.

BRIEF DESCRIPTION OF THE MARK OF DRAWINGS

10 skyrmion
20 timing notch
1000 half-adder (first half-adder)
1000' second half-adder
1100 half-adder input part
1100' second half-adder input part.
1110 half-adder first input terminal
1110' second half-adder first input terminal
1120 half-adder second input terminal
1220' second half-adder second input terminal
1200 half-adder operation part
1200' second half-adder operation part
1210 half-adder notch
1210' second half-adder notch
1300 half-adder output part
1310' second half-adder output part
1310 half-adder first: output terminal
1310' second half-adder first output terminal
1320 half-adder second output terminal
1320' second half-adder second output terminal
2000 full-adder (first full-adder)
2000' second full-adder
2100 full-adder input part
2100' second full-adder input part
2110 full-adder first input terminal
2110' second full-adder first input terminal
2120 full-adder second input terminal
2120' second full-adder second input terminal
2130 full-adder third input terminal
2130' second full-adder third input terminal
2210 full-adder first operation part
2210' second full-adder first operation part
2220 full-adder second operation part
2220' second full-adder second operation part
2300 full-adder output part
2300' second full-adder output part
2310 full-adder first output terminal
2310' second full-adder first output terminal
2320 full-adder second output terminal
2320' second full-adder second output terminal
3000 logic device
3100 logic device first: input part
3200 logic device second input part
3300 logic device third input part
3400 logic device output part

What is claimed is:

1. A logic device using an annihilation of skyrmion, which comprises an input part; an output part; and an operation part located between the input part and the output part and includes at least one notch, and
    wherein the logic device comprises a nonmagnetic layer and a magnetic layer formed on the nonmagnetic layer, the skyrmion and the at least one notch are located on the magnetic layer,
    wherein a current is applied to the nonmagnetic layer to cause spin at each position to rotate by a spin transfer torque or a spin orbit torque to moves the skyrmion from the input part to the output part,
    wherein when only one skyrmion is input to the input part, the one skyrmion is preserved in the operation part and moves to the output part, and
    when two skyrmions are input to the input part, the two skyrmions repel each other in the operation part, and thus one skyrmion is annihilated at the at least one notch and the other skyrmion moves to the output part.

2. The logic device according to claim 1, wherein the at least one notch is located on a first side of the operation part in a direction in which the skyrmion is bent by skyrmion Hall effect.

3. The logic device according to claim 1, wherein the logic device further includes a timing notch configured to prevent the skyrmion from moving when current below a specific value is applied.

4. A half-adder comprising an input part where skyrmion is input and includes two input terminals partitioned from each other; an operation part where the two input terminals extend and meet, including a notch; and an output part that is connected to the operation part and includes two output terminals partitioned from each other to which a remaining skyrmion reaches by performing operations by the operation part, wherein the half-adder comprises a nonmagnetic layer and a magnetic layer formed on the nonmagnetic layer, the skyrmion and the notch are located on the magnetic layer,
wherein a current is applied to the nonmagnetic layer to cause spin at each position to rotate by spin transfer torque or a spin orbit torque to moves the skyrmion from the input part to the output part,
wherein when only one skyrmion is input to the input part, the one skyrmion is preserved in the operation part and moves to the output part, and
when two skyrmions are input to the input part, the two skyrmions repell each other in the operation part, and thus one skyrmion is annihilated at the notch and the other skyrmion moves to the output part.

5. The half-adder according to claim 4, wherein the notch is located on a first side of the operation part in a direction in which the skyrmion is bent by skyrmion Hall effect.

6. The half-adder according to claim 5, wherein the input part includes a first input terminal located on a first side of the two input terminals and a second input terminal located on an opposite side of the first side, the output part includes a first output terminal located on a first side of the two output terminals and a second output terminal located on an opposite side of the first side.

7. The half-adder according to claim 6, wherein the first output terminal functions as an XOR gate, and the second output terminal functions as an AND gate.

8. The half-adder according to claim 6, wherein the first output terminal outputs a sum signal, and the second output terminal outputs a carry signal.

9. The half-adder according to claim 6, wherein the half-adder further includes a timing notch configured to prevent the skyrmion from moving when current below a specific value is applied.

10. A full-adder including a first half-adder and a second half-adder made of the half-adder of claim 6, wherein the full-adder comprises an input part containing a first input terminal of the full-adder connected to a first input terminal of the second half-adder, a second input terminal of the full-adder connected to a first input terminal of the first half-adder, and a third input terminal of the full-adder connected to a second input terminal of the first half-adder; a first operation part of the full-adder including the operation part of the first half-adder; a second operation part of the full-adder including the operation part of the second half-adder; and an output part containing a first output terminal of the full-adder connected to a first output terminal of the second half-adder and a second output terminal of the full-adder connected to a second output terminal of the second half-adder and a second output terminal of the first half-adder; wherein the first output terminal of the first half-adder is connected to the second input terminal of the second half-adder.

11. The full-adder according to claim 10, wherein the first input terminal of the full-adder inputs a carry signal, the first output terminal of the full-adder outputs a sum signal, and the second output terminal of the full-adder outputs a carry signal.

12. A logic device including a half-adder comprising an input part where skyrmion is input and includes two input terminals partitioned from each other; an operation part where the two input terminals extend and meet, including a notch; and an output part that is connected to the operation part and includes two output terminals partitioned from each other to which a remaining skyrmion reaches by performing operations by the operation part, wherein the half-adder comprises a nonmagnetic layer and a magnetic layer formed on the nonmagnetic layer, the skyrmion and the notch are located on the magnetic layer,
wherein a current is applied to the nonmagnetic layer to cause spin at each position to rotate by a spin transfer torque or a spin orbit torque to moves the skyrmion from the input part to the output part,
and one or more full-adders comprising an input part containing a first input terminal of the one or more full-adders connected to a first input terminal of a second half-adder, a second input terminal of the one or more full-adders connected to a first input terminal of a first half-adder, and a third input terminal of the one or more full-adders connected to a second input terminal of the first half-adder; a first operation part of the one or more full-adders including the operation part of the first half-adder; a second operation part of the one or more full-adders including the operation part of the second half-adder; and an output part containing a first output terminal of the one or more full-adders connected to a first output terminal of the second half-adder and a second output terminal of the one or more full-adders connected to a second output terminal of the second half-adder and a second output terminal of the first half-adder; wherein the first output terminal of the first half-adder is connected to the second input terminal of the second half-adder, and wherein the first half-adder and the second half-adder comprises a non-magnetic layer and a magnetic layer formed on the nonmagnetic layer of the first half-adder and the second half-adder, wherein a current is applied to the nonmagnetic layer of the first half-adder and the second half-adder to cause spin at each position to rotate by the spin transfer torque or the spin orbit torque to move skyrmion from the input part of the one or more full-adders to the output part of the one or more full-adders,
wherein the logic device comprises a first input part including a first input terminal of the half-adder and a second input terminal of the half-adder; a second input part including a second input terminal of a first full-adder of the one or more full-adders and a third input terminal of the first full-adder; and a first output part including a first output terminal of the half-adder and a first output terminal of the first full-adder; wherein a second output terminal of the half-adder is connected to the first input terminal of the first full-adder.

13. The logic device according to claim 12, wherein the second output terminal of the half-adder transmits a carry signal to the first input terminal of the first full-adder.

14. The logic device according to claim 12, wherein the logic device includes n full-adders, wherein the logic device comprises the first input part including the first input terminal of the half-adder and the second input terminal of the half-adder; the second input part including the second input terminal of the first full-adder and the third input terminal of the first full-adder; a third input part to a $n+1^{th}$ input part including a second input terminal and a third input terminal of each of a second full-adder to a $n^{th}$ full-adder; and the first output part including the first output terminal of the half-adder, a first output terminal of the first full-adder to an-$1^{th}$ full-adder, a first output terminal of the $n^{th}$ full-adder and a second output terminal of the $n^{th}$ full-adder; wherein a second output terminal of a $k-1^{th}$ full-adder is connected to a first input terminal of a $k^{th}$ full-adder ($2 \leq k \leq n$, n and k are natural numbers).

15. The logic device according to claim 12, wherein the second output terminal of the half-adder transmits a carry signal to the first input terminal of the first full-adder, and the second output terminal of the $k-1^{th}$ full-adder transmits a carry signal to the first input terminal of the $k^{th}$ full-adder.

* * * * *